(12) United States Patent
Lee et al.

(10) Patent No.: US 11,963,372 B2
(45) Date of Patent: Apr. 16, 2024

(54) THREE-TERMINAL ELECTRO-CHEMICAL MEMORY CELL WITH VERTICAL STRUCTURE FOR NEUROMORPHIC COMPUTATION AND MEMORY CELL ARRAY INCLUDING THE SAME

(71) Applicant: SEOUL NATIONAL UNIVERSITY R&DB FOUNDATION, Seoul (KR)

(72) Inventors: Yun Seog Lee, Seoul (KR); Hyunjoon Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 317 days.

(21) Appl. No.: 17/469,372

(22) Filed: Sep. 8, 2021

(65) Prior Publication Data
US 2022/0375994 A1   Nov. 24, 2022

(30) Foreign Application Priority Data
May 18, 2021   (KR) .................. 10-2021-0063858

(51) Int. Cl.
*H10B 63/00* (2023.01)
*G06N 3/063* (2023.01)
*H10N 70/20* (2023.01)

(52) U.S. Cl.
CPC ............ *H10B 63/845* (2023.02); *G06N 3/063* (2013.01); *H10B 63/34* (2023.02); *H10N 70/24* (2023.02)

(58) Field of Classification Search
CPC ...... H10B 63/845; H10B 63/34; H10B 63/84; G06N 3/063; G06N 3/065; H10N 70/24; H10N 70/253; H10N 70/826; H10N 70/8833
See application file for complete search history.

(56) References Cited

U.S. PATENT DOCUMENTS

2020/0273911 A1* 8/2020 Tang .................. H10N 70/8833
2020/0373354 A1* 11/2020 Tang .................... H10N 70/253

* cited by examiner

*Primary Examiner* — Allison Bernstein
(74) *Attorney, Agent, or Firm* — Paratus Law Group, PLLC

(57) ABSTRACT

Disclosed is a three-terminal electro-chemical memory cell with a vertical structure for neuromorphic computation, including a circumferential hole, first and second conductive electrode layers sequentially stacked along an outer surface of the circumferential hole, an electrolyte layer formed along an inner surface of the circumferential hole and connected to one end of each of the first and second conductive electrode layers, and a gate electrode disposed parallel to the electrolyte layer in an inner surface direction of the circumferential hole.

12 Claims, 14 Drawing Sheets

THREE-TERMINAL ELECTRO-CHEMICAL MEMORY CELL WITH VERTICAL STRUCTURE FOR NEUROMORPHIC COMPUTATION AND MEMORY CELL ARRAY INCLUDING THE SAME

CROSS-REFERENCE TO RELATED APPLICATION

This application claims priority to and the benefit of Korean Patent Application No. 10-2021-0063858 (filed on May 18, 2021), which is hereby incorporated by reference in its entirety.

BACKGROUND

The present disclosure relates to three-terminal electro-chemical memory cells with a vertical structure for neuromorphic computation and memory cell arrays including the same, and more specifically, to metal oxide-based electro-chemical memory cells with a three-dimensional vertical structure and memory cell arrays including the same.

In the von Neumann computer architecture used as an implementation method for artificial neural networks in the field of artificial intelligence which is growing rapidly in recent years, it takes a lot of time and power to train due to a memory bottleneck phenomenon. As an alternative, analog cross-point arrays of synaptic non-volatile memory devices are emerging as a new architecture specialized for neuromorphic computation. The cross-point array may compute vector-matrix multiplication and vector outer product update with time complexity O(1) in an analog manner using memory arrays that may be programmed with multiple conductance values. The analog cross-point array is a technology that is expected to reduce the training time and power consumption significantly since the analog cross-point array may perform the vector-matrix multiplication and vector outer product update, which are key operations used for the training of the artificial neural network, with low time complexity, and perform the weight matrix update in a memory without individual access to the memory.

In the case of the cross-point array in which three-terminal memory devices are arranged with a conductance matrix G value, a voltage vector $\vec{V}_{drain}$ is applied to a drain of the array, a current vector $\vec{I}_{source}$ is read from a source, a voltage vector $\vec{V}_{source}$ is applied to the source, or a current vector $\vec{I}_{drain}$ is read from the drain, and thus, a vector-matrix multiplication operation can be performed using an equation of $\vec{I}_{drain}=G\vec{V}_{source}$ and $\vec{I}_{source}=G^T\vec{V}_{source}$. The vector outer product update can be performed as $G \leftarrow G+\eta \vec{x}_{gate}\vec{\delta}_{source}^T$ ($\eta$: proportionality constant) by applying a voltage vector $\vec{x}_{gate}$ to the gate of the array and a voltage vector $\vec{\delta}_{source}$ to the source. A phase-change random access memory (PRAM), a resistive random access memory (RRAM), and the like have been proposed as unit devices for implementing the analog cross-point array, but the phase-change memory has a disadvantage that set/reset programming is unidirectional, and the resistive change memory can be bidirectionally programmed, but has a disadvantage that programming is performed probabilistically, and therefore, the phase-change memory and the resistive change memory have been difficult to commercialize.

An electro-chemical random access memory (ECRAM) has the advantage of being able to precisely control a direction and degree of programming by controlling the amount of ions inserted/extracted into the channel by the amount of current applied to the gate, but unlike the phase-change memory and the resistive change memory which are two-terminal devices, the electro-chemical random access memory (ECRAM) is a three-terminal device, and therefore has been difficult to achieve high integration.

SUMMARY

The present disclosure provides a three-terminal electro-chemical memory cells with a vertical structure for neuromorphic computation and a memory cell array including the same capable of simplifying a process and improving integration of a device by forming the three-terminal electro-chemical memory cells with a vertical structure for multi-layered three-dimensional vertical structure type neuromorphic computation.

In an aspect, a three-terminal electro-chemical memory cell with a vertical structure for neuromorphic computation includes a circumferential hole, first and second conductive electrode layers sequentially stacked along an outer surface of the circumferential hole, an electrolyte layer formed along an inner surface of the circumferential hole and connected to one end of each of the first and second conductive electrode layers, and a gate electrode disposed parallel to the electrolyte layer in an inner surface direction of the circumferential hole.

In another aspect, a three-terminal electro-chemical memory cell with a vertical structure for neuromorphic computation includes a circumferential hole, first and second conductive electrode layers sequentially stacked along an outer surface of the circumferential hole, a channel layer formed along an inner surface of the circumferential hole and connected to one end of each of the first and second conductive electrode layers, and a gate electrode layer disposed parallel to the electrolyte layer in an inner surface direction of the circumferential hole.

The first and second conductive electrode layers may constitute a disk shape in contact with the outer surface of the circumferential hole, and be spaced apart through an insulator.

The three-terminal electro-chemical memory cell may further include: an insulator filled in the inner surface of the gate electrode layer.

The electrolyte layer may be formed as a circumferential surface inside a circumferential channel layer in contact with the inner surface of the circumferential hole.

The channel layer may be formed between the inner surface of the circumferential hole and the outer surface of the electrolyte layer formed as a circumferential surface.

The three-terminal electro-chemical memory cell may further include: an ion reservoir layer in contact with the inner surface of the electrolyte layer and formed as the circumferential surface.

The ion reservoir layer may be made of Molybdenum oxide.

In another aspect, a circumferential three-terminal memory cell with a vertical structure for neuromorphic computation includes: a channel layer, an electrolyte layer, and a gate electrode layer sequentially forming a circumferential surface toward an inside; and first and second conductive electrode layers sequentially stacked in a disk shape on an outside of the circumferential surface.

In another aspect, a three-terminal memory cell with a vertical structure for neuromorphic computation includes: a channel layer, an electrolyte layer, and a gate electrode layer sequentially forming a circumferential surface toward an inside; first and second conductive electrode layers sequentially stacked in a disk shape on an outside of the circumferential surface; a drain line connected to the first conductive electrode layer; a source line connected to the second conductive electrode layer; and a gate line connected to the gate electrode layer.

DETAILED DESCRIPTION

Figure 1A:
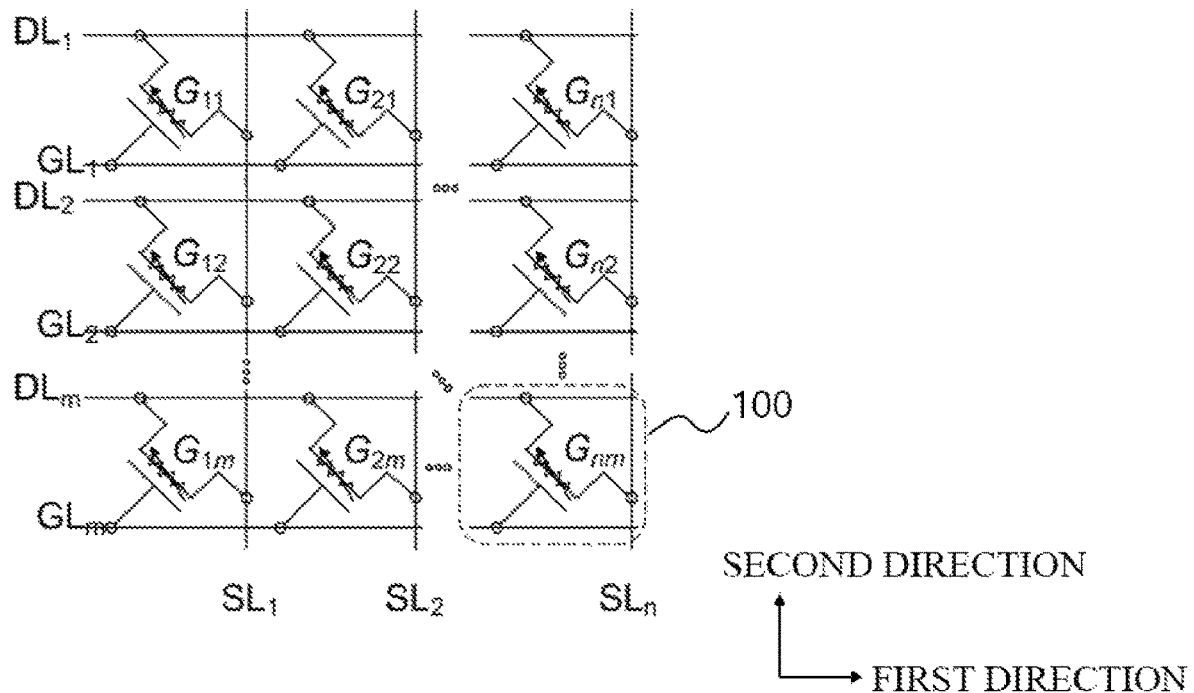
FIG. 1A is an equivalent circuit schematically illustrating an electro-chemical memory cell array according to an embodiment of the present disclosure.

Since the description of the present disclosure is merely an embodiment for structural or functional explanation, the scope of the present disclosure should not be construed as being limited by the embodiments described in the text. That is, since the embodiments may be variously modified and may have various forms, the scope of the present disclosure should be construed as including equivalents capable of realizing the technical idea. In addition, a specific embodiment is not construed as including all the objects or effects presented in the present disclosure or only the effects, and therefore the scope of the present disclosure should not be understood as being limited thereto.

On the other hand, the meaning of the terms described in the present application should be understood as follows.

Terms such as "first" and "second" are intended to distinguish one component from another component, and the scope of the present disclosure should not be limited by these terms. For example, a first component may be named a second component and the second component may also be similarly named the first component.

It is to be understood that when one element is referred to as being "connected to" another element, it may be connected directly to or coupled directly to another element or be connected to another element, having the other element intervening therebetween. On the other hand, it is to be understood that when one element is referred to as being "connected directly to" another element, it may be connected to or coupled to another element without the other element intervening therebetween. In addition, other expressions describing a relationship between components, that is, "~between", "~directly between", "~neighboring to?", "~directly neighboring to" and the like, should be similarly interpreted.

It should be understood that the singular expression include the plural expression unless the context clearly indicates otherwise, and it will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

In each step, an identification code (for example, a, b, c, and the like) is used for convenience of description, and the identification code does not describe the order of each step, and each step may be different from the specified order unless the context clearly indicates a particular order. That is, the respective steps may be performed in the same sequence as the described sequence, be performed at substantially the same time, or be performed in an opposite sequence to the described sequence.

Unless defined otherwise, all the terms used herein including technical and scientific terms have the same meaning as meanings generally understood by those skilled in the art to which the present disclosure pertains. It should be understood that the terms defined by the dictionary are identical with the meanings within the context of the related art, and they should not be ideally or excessively formally defined unless the context clearly dictates otherwise.

Hereinafter, preferred embodiments of the present disclosure will be described in more detail with reference to the drawings. Hereinafter, the same components will be denoted by the same reference numerals throughout the drawings, and an overlapping description for the same components will be omitted.

FIG. 1A is a circuit diagram schematically illustrating a memory cell array according to an embodiment of the present disclosure.

Referring to FIG. 1A, a cell array is configured to include a plurality of unit memory cells 100 arranged in an m×n array in a first direction and a second direction. The first direction and the second direction may be directions crossing each other.

Each unit memory cell 100 has gates G, drain terminals, and source terminals. The gates G of each unit memory cell 100 is connected to the gate lines GL1, GL2, . . . , GLm. In addition, the drain terminals of each unit memory cell 100 are connected to the drain lines DL1, DL2, . . . , DLm, and the source terminals of each unit memory cell 100 are connected to the source lines SL1, SL2, . . . , SLm. The unit memory cells 100 arranged in the same row along the first direction are connected to common gate lines GL1, GL2, . . . , GLm and drain lines DL1, DL2, . . . , DLm, and the unit memory cells 100 arranged in the same column along the second direction are connected to the source lines SL1, SL2, . . . , SLm.

Each unit device constituting such a memory cell array may have a different conductance Gij, and the electrical conductivity thereof may be changed by applying a programming voltage to GLj and SLi, and may be accessed by measuring the conductance between DLj and SLi.

Figure 1B:
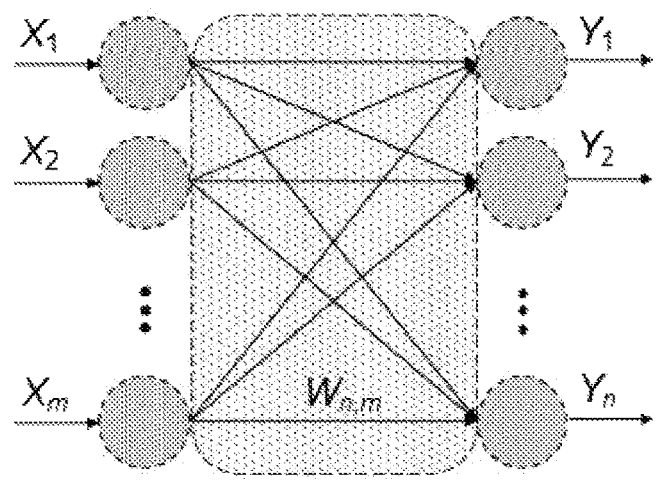
FIG. 1B is an artificial neural network corresponding to the electro-chemical memory cell array according to the embodiment of the present disclosure.

FIG. 1B is a conceptual diagram schematically illustrating an artificial neural network corresponding to the memory cell array according to the embodiment of the present disclosure.

Referring to FIG. 1B, a synaptic weight (Wn,m) represents strengths of outputs X1, X2, . . . , Xm of an input layer or a previous neural network layer that pass through neurons and connect to inputs of the next neurons, Y1, Y2, . . . , Yn represent outputs of the next neurons. Here, the conductance matrix Gij of the memory cell array of FIG. 1 has a scalar multiple relationship with [Wnm] of FIG. 1(2) and may correspond thereto.

Figure 2:
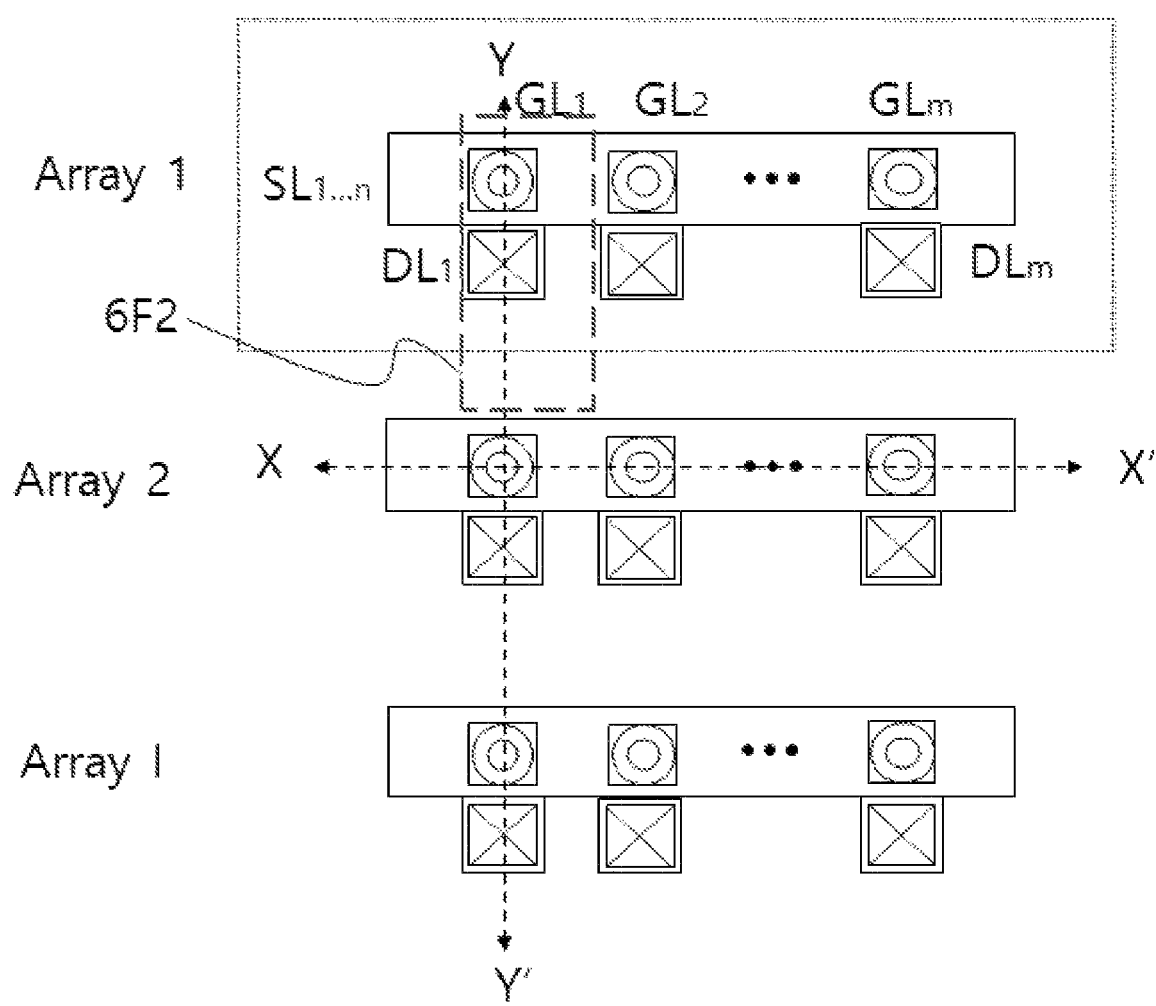
FIG. 2 is a plan view illustrating the electro-chemical memory cell array according to the embodiment of the present disclosure.

FIG. 2 is a plan view illustrating the memory cell array according to the embodiment of the present disclosure.

FIG. 2 illustrates a memory cell array including a multi-layered three-dimensional vertical structure type memory cell configured by stacking and arranging unit devices, in which sizes m and n of the cell array include positive integers of 2 or more, and the number I of cell arrays may include any positive integer.

The single memory cell array includes a gate line GL, a source line SL formed along an inner surface of a circumferential hole, and a drain line DL formed in a direction perpendicular to the source line. In this case, the source line SL and the drain line DL may be formed by being sequentially stacked along an outer surface of the circumferential hole. The source line SL is formed in the form of a line along gate electrodes adjacent to an X axis, and the drain line DL is formed in the form of a bar extending along a Y axis perpendicular to the source line SL. As illustrated in FIG. 2, as the three-dimensional vertical structure type memory cell is configured in 6F2, an area occupied by the memory cell is reduced compared to the related art, thereby enabling miniaturization and high performance of the device, and as more memory cells can be formed in the same area, a high-density array may be implemented.

Figure 3:
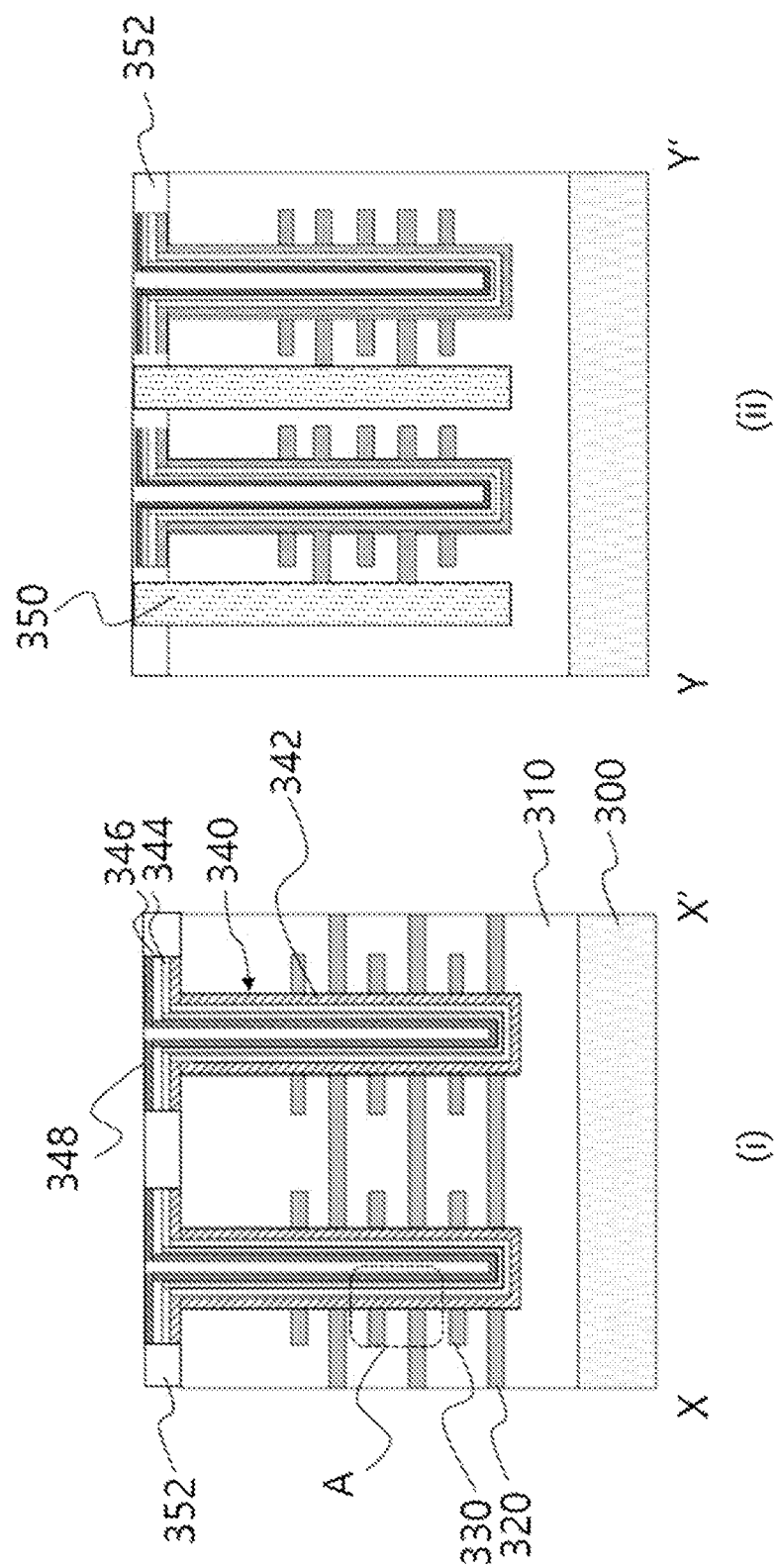
FIG. 3 is a cross-sectional view illustrating the electro-chemical memory cell according to the embodiment of the present disclosure.

FIG. 3 is a cross-sectional view illustrating an electrochemical memory cell according to an embodiment of the present disclosure, and FIG. 3I is a cross-sectional view illustrating a cut section taken along X-X' of FIG. 2, and FIG. 3II is a cross-sectional view illustrating a cut section taken along Y-Y' of FIG. 2.

Referring to FIG. 3, an interlayer insulating layer 310 including a circumferential hole 340 is formed on a semiconductor substrate 300, and a first conductive electrode layer 330 and a second conductive electrode layer 329 are sequentially stacked along an outer surface of a circumferential hole 340. The first conductive electrode layer 330 and the second conductive electrode layer 320 constitute a disk shape in contact with the outer surface of the circumferential hole, and are provided spaced apart through an insulator.

A channel layer 342, an electrolyte layer 344, an ion reservoir layer 346, and a gate electrode layer 348 that are formed along the inner surface of the circumferential hole 340 and connected to one end of each of the first conductive electrode layer 330 and the second conductive electrode layer 320 are provided, and an insulator filling an inner surface of the gate electrode layer 348 is further provided.

The first conductive electrode layers 330 are electrically connected through the circumferential hole and adjacent via contacts 350 (refer to FIG. 3II).

Here, each unit device is arranged in multilayer and horizontally in order to be electrically connected in the form of an array of cross points. The source terminals of the unit devices may be connected along the x-axis to constitute the source lines SL1. SL2, . . . , SLn, and the gate electrode and the drain terminal may be connected in a depth direction to constitute the gate lines GL1, GL2, . . . , GLm and the drain lines DL1, DL2, . . . , DLm.

Figure 4:
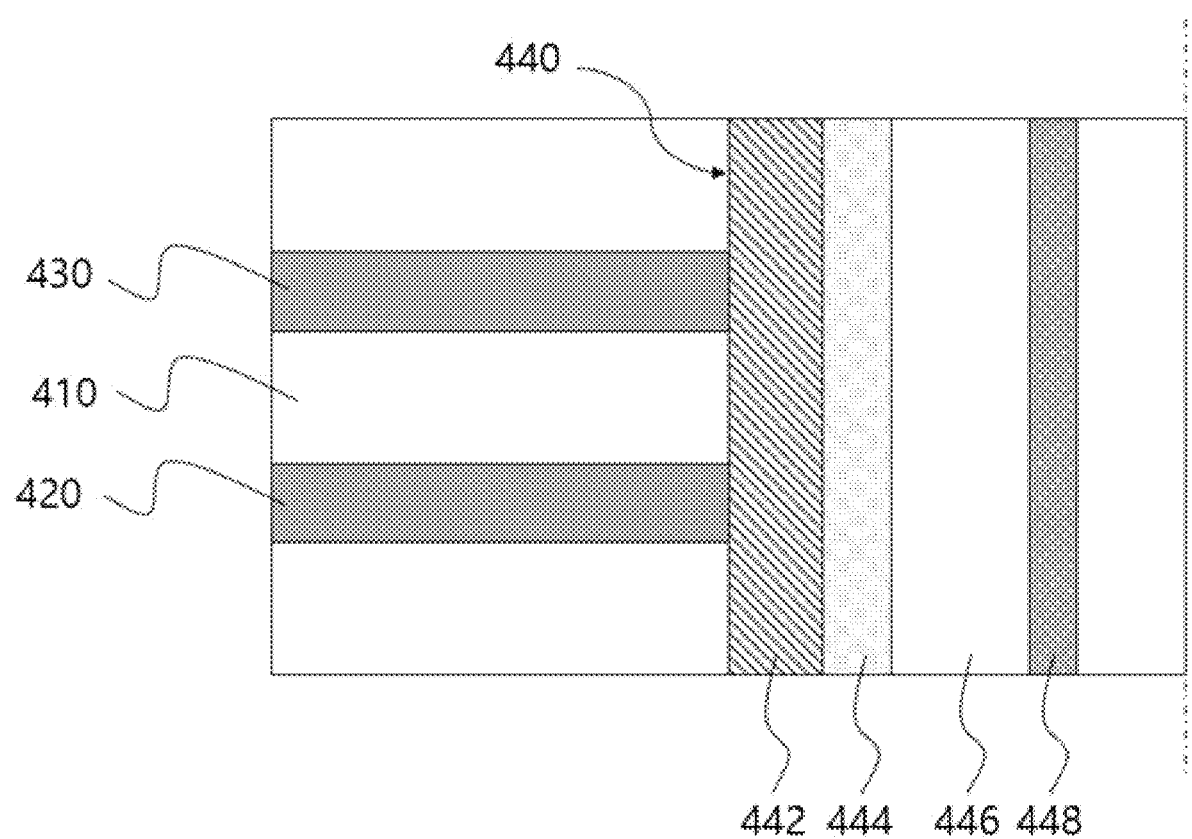
FIG. 4 is an enlarged cross-sectional view of part A of FIG. 3.

FIG. 4 is an enlarged cross-sectional view of portion 'A' of FIG. 3 and illustrates some of unit memory cells. Components of the unit memory cell will be described in more detail with reference to FIG. 4 as follows.

Referring to FIG. 4, a first conductive electrode layer 430 and a second conductive electrode layer 420 are sequentially stacked along an outer surface of a circumferential hole 440.

The first conductive electrode layer 430 and the second conductive electrode layer 420 may be made of a material including W. The first conductive electrode layer 430 serves as a drain line, and the second conductive electrode layer 420 serves as a source line. The first conductive electrode layer 430 and the second conductive electrode layer 420 are formed spaced apart from each other through an insulator 410 made of a material including SiO2. That is, the first conductive electrode layer 430 serving as the drain line and the second conductive electrode layer 420 serving as the source line have a parallel structure.

Since a thickness of the insulator 410 between the first conductive electrode layer 430 and the second conductive electrode layer 420 can be reduced through a deposition process, there is an advantage in that a distance between the drain line and the source line can be easily adjusted compared to a lithography process that is generally performed.

A channel layer 442, an electrolyte layer 444, an ion reservoir layer 446, and a gate electrode layer 448 are sequentially disposed inwardly from the circumferential hole 440. It is preferable that the channel layer 442 is preferably made of W oxide, the electrolyte layer 444 is made of Hf oxide, and the ion reservoir layer 446 is made of Mo oxide. In addition, the channel layer 442 may be made of any one selected from Ti oxide, Y oxide, Zr oxide, or a combination thereof.

In the memory cell having such a structure, when 0V is applied to the source line and a bias of ±Vprog or more is applied to the gate electrode, oxygen ions or oxygen vacancies move through the electrolyte layer 444 under the influence of an electric field formed between the channel layer 442 and the ion reservoir layer 446, and an electrochemical reaction is induced in the channel layer 442, which causes the conductance of the channel to change.

FIGS. 5A to 5L are cross-sectional views illustrating a method of manufacturing a memory cell array according to an embodiment of the present disclosure.

Figure 5A:
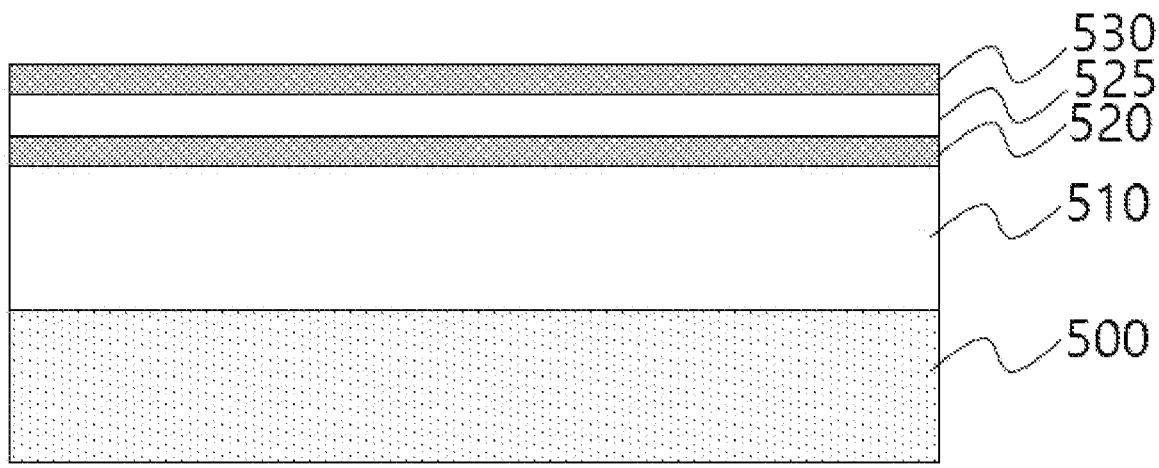
FIGS. 5A to 5L are cross-sectional views illustrating a method of manufacturing an electro-chemical memory cell array according to an embodiment of the present disclosure.

First, referring to FIG. 5A, an interlayer insulating layer 510 is formed on a semiconductor substrate 500. The interlayer insulating film 510 is formed to insulate an electrode from the semiconductor substrate 500 which is a silicon substrate. The interlayer insulating film 510 may be formed of a dielectric thin film such as a silicon oxide film or a silicon nitride film, and may be formed by a chemical vapor deposition (CVD) process.

Next, a first conductive electrode layer 520, an insulator 525, and a second conductive electrode layer 530 are sequentially formed on the interlayer insulating layer 510.

Figure 5B:
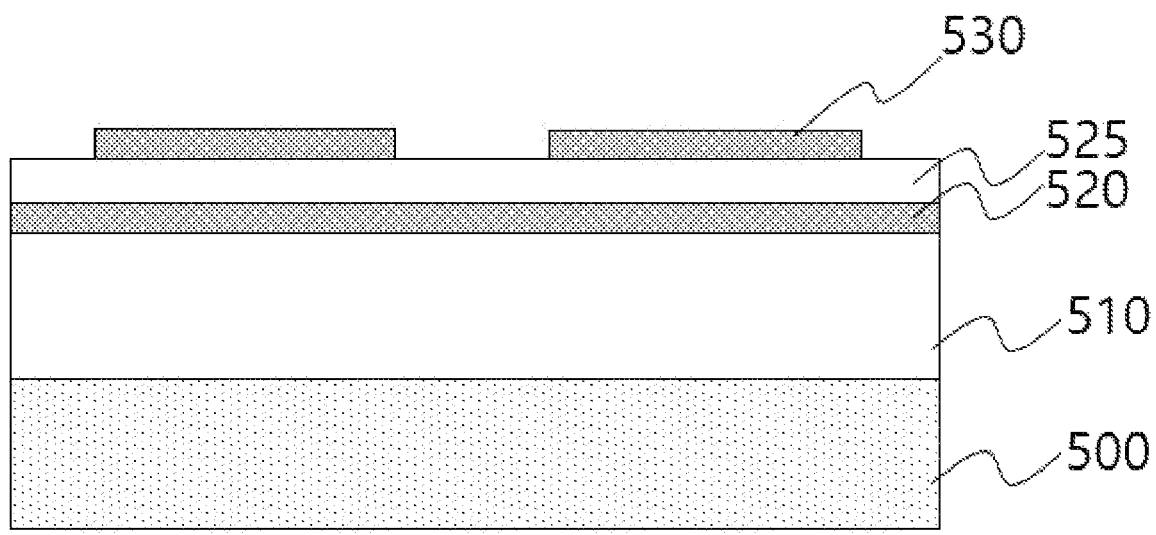

Referring to FIG. 5B, after forming a mask pattern on the second conductive electrode layer 530, the second conductive electrode layer 530 is etched using the mask pattern as an etch mask to form separated line patterns.

Figure 5C:
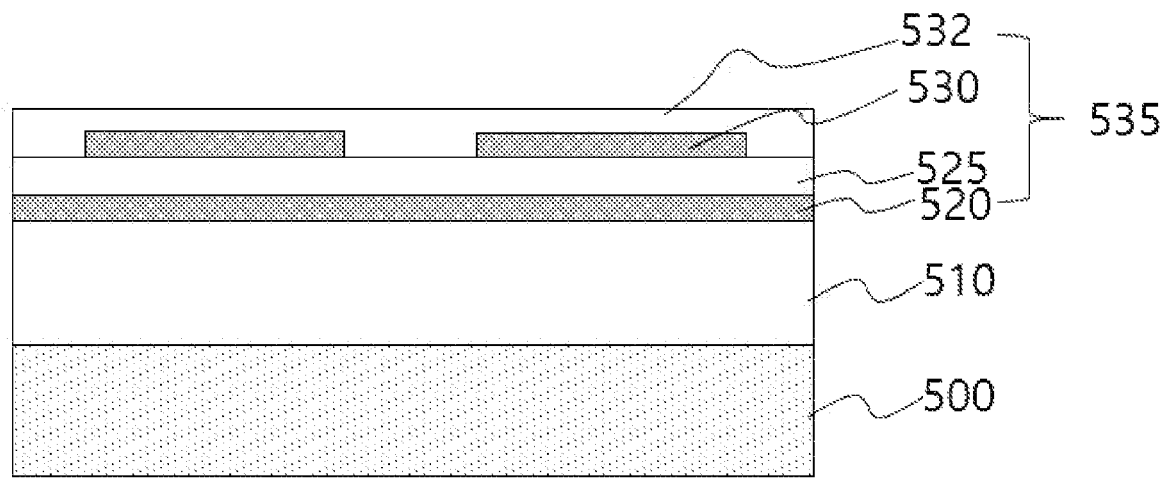

Referring to FIG. 5C, an additional insulator 532 is formed on the insulator 525 including the patterned second conductive electrode layer 530 to form a first conductive electrode layer 520, an insulator 525, a second conductive electrode layer 530, and an insulator 532, thereby forming a stacked structure 535.

Figure 5D:
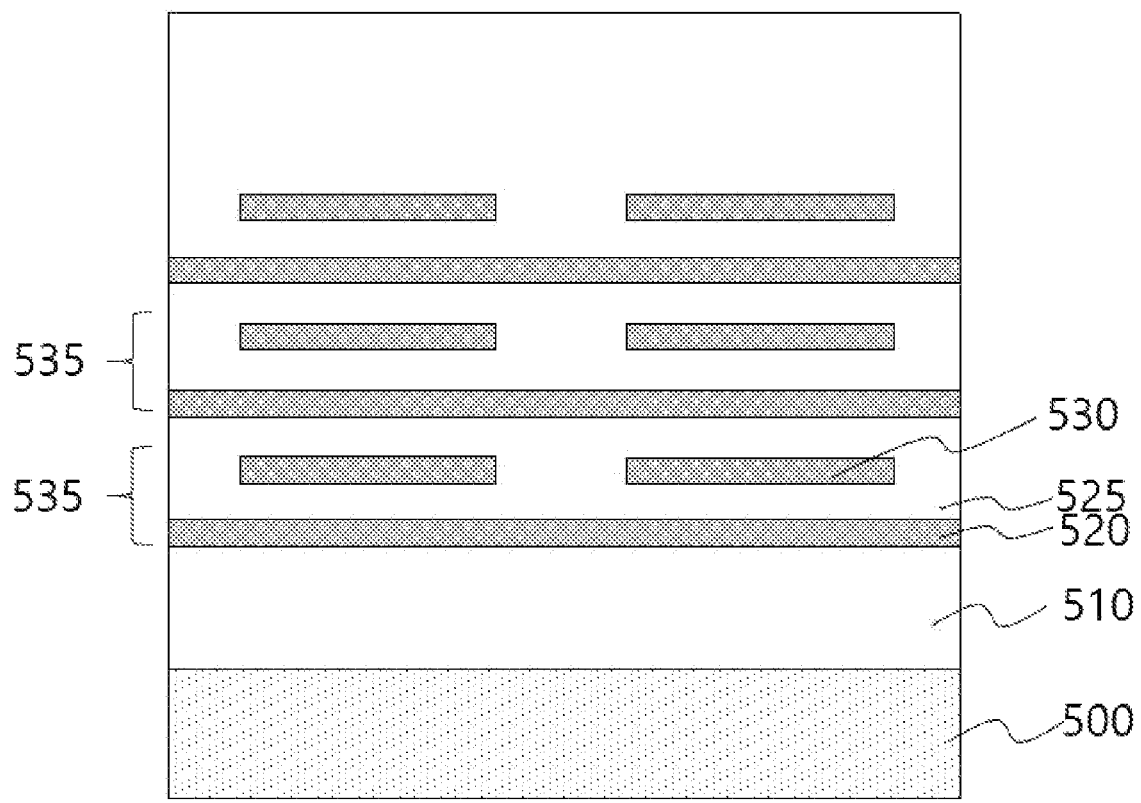

Referring to FIG. 5D, the stacked structure 535 formed in FIG. 5C is repeated n times to form an n-layer stacked structure.

Figure 5E:
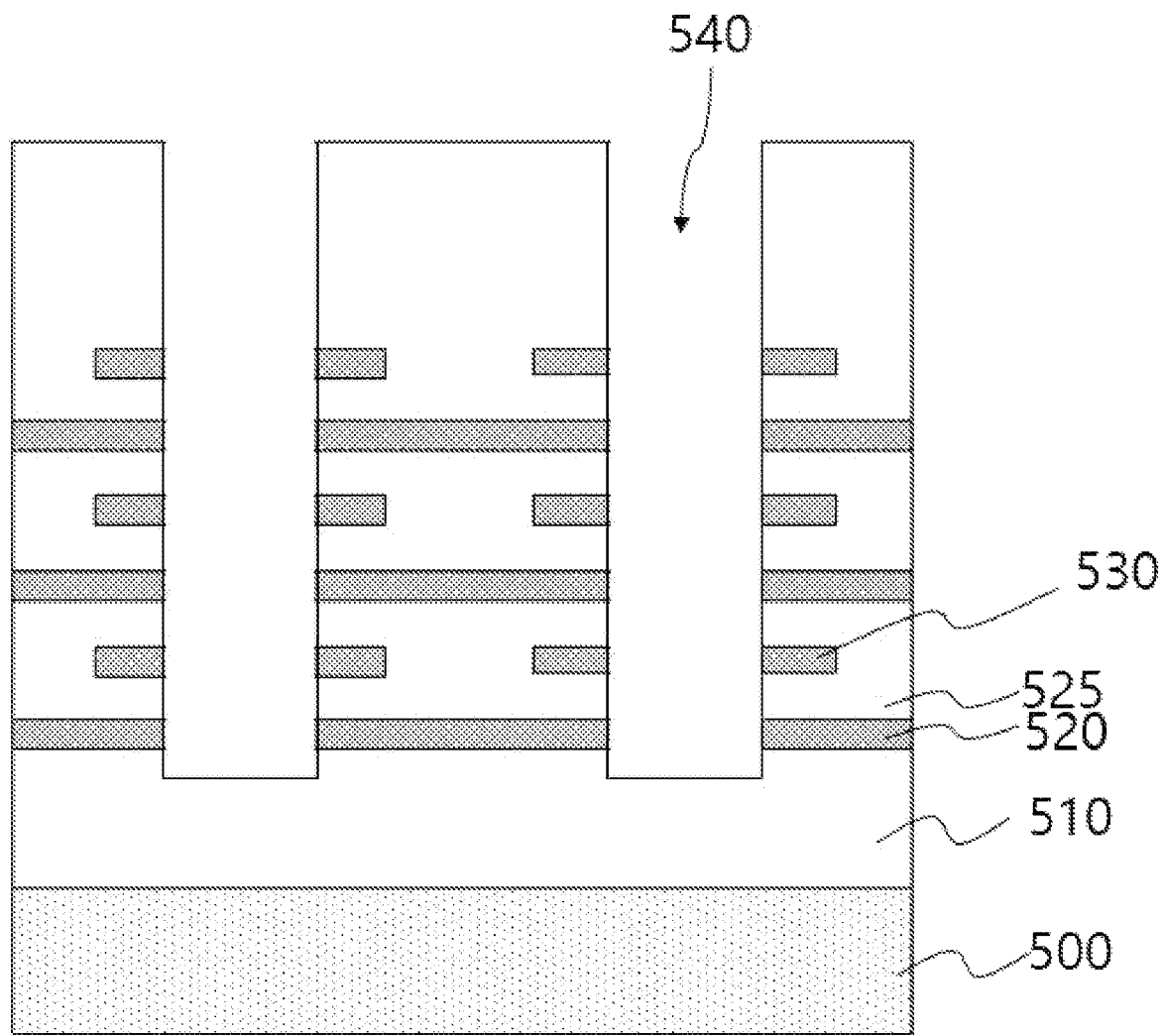

Referring to FIG. 5E, a mask pattern for opening a gate region is formed on the insulator formed at the top of the repeated stacked structure 535, and the stacked structure 535 is etched using the mask pattern as an etch mask to form a circumferential hole 540 exposing the interlayer insulating layer 510.

Figure 5F:
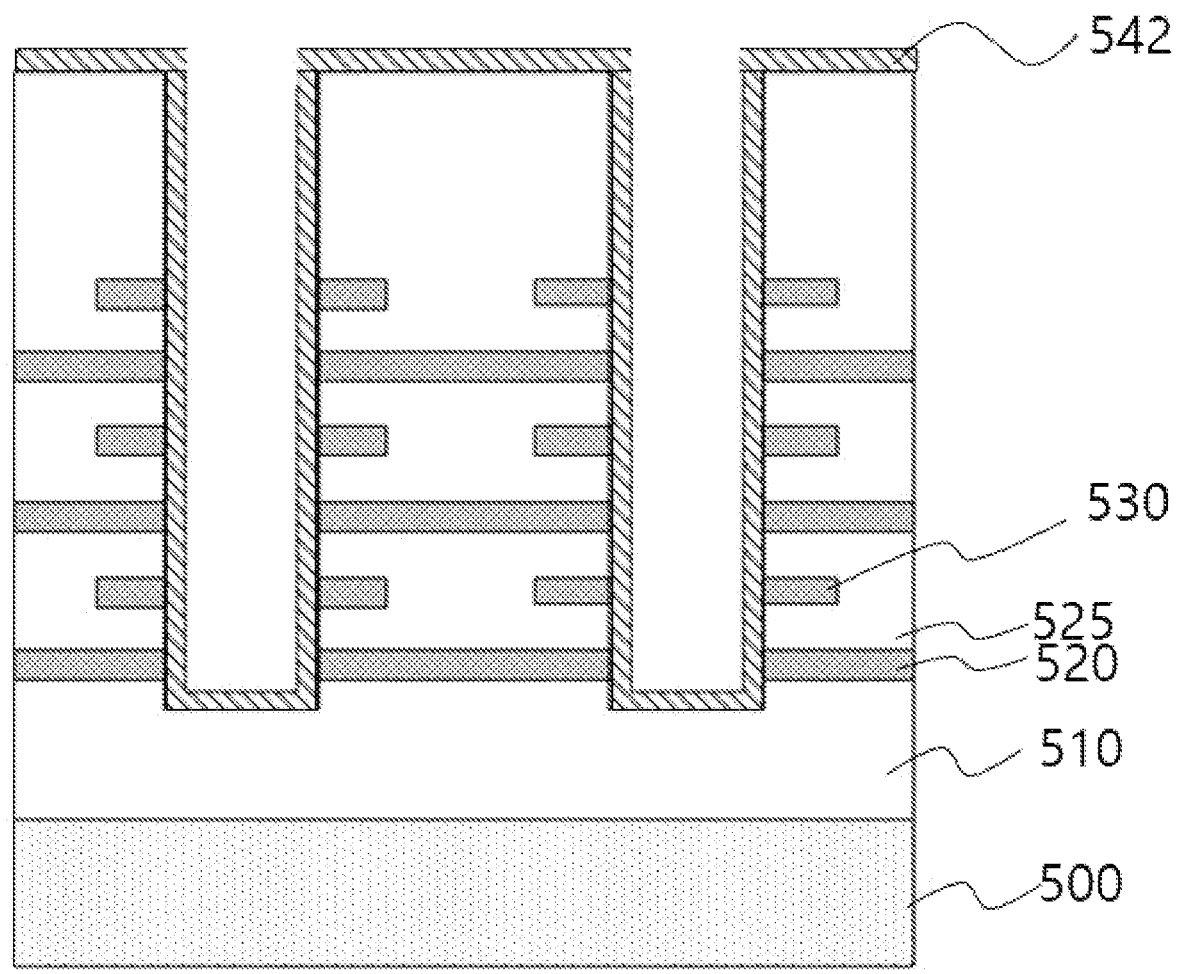
Figure 5G:
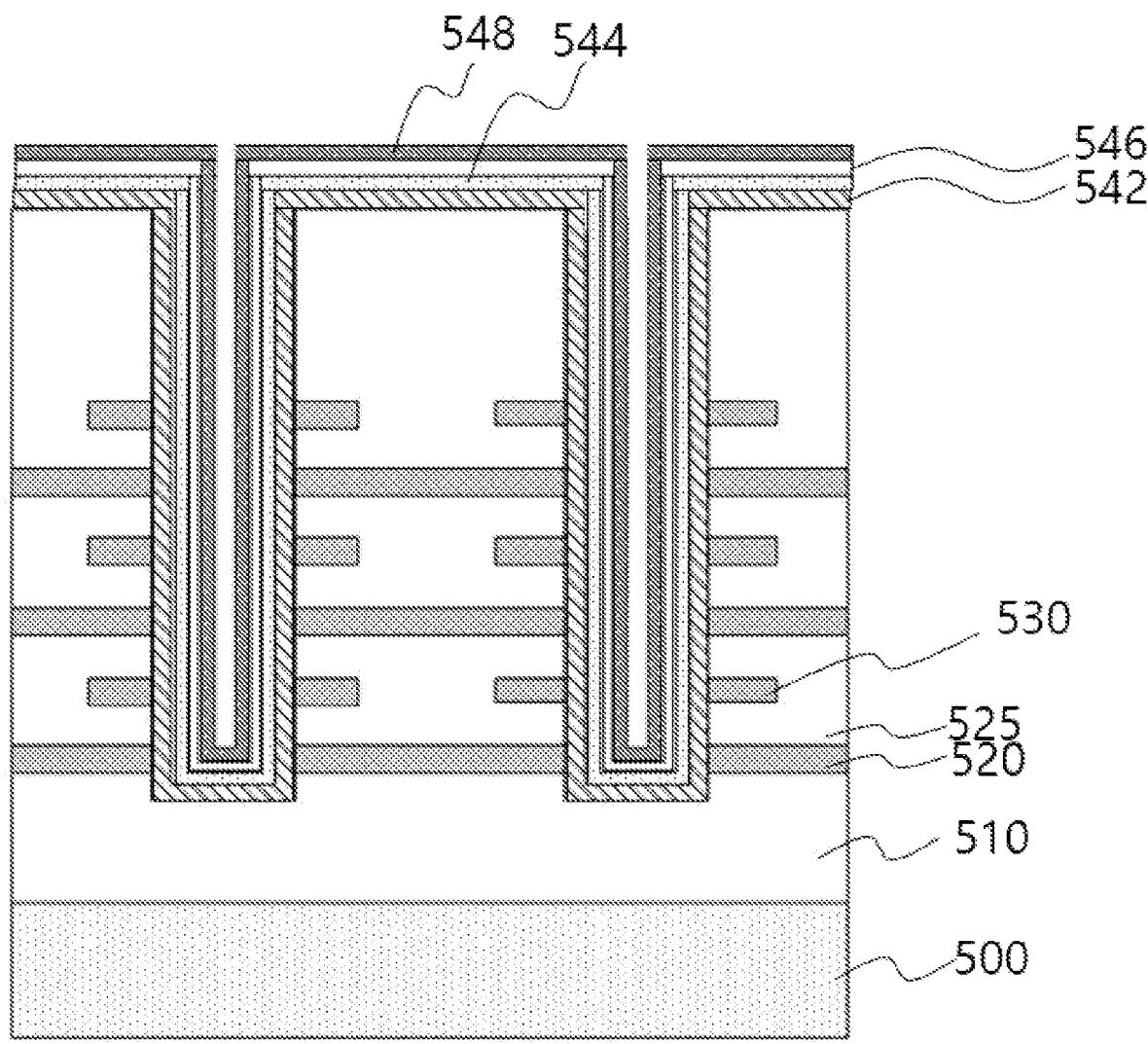

Referring to FIGS. 5F and 5G, a channel layer 542, an electrolyte layer 544, an ion reservoir layer 546, and a gate electrode layer 548 having a predetermined thickness are sequentially deposited on the entire surface including the circumferential hole 540. It is preferable that the channel layer 542 is preferably made of W oxide, the electrolyte layer 544 is made of Hf oxide, and the ion reservoir layer 546 is made of Mo oxide. In addition, the channel layer 442 may be made of any one selected from Ti oxide, Y oxide, Zr oxide, or a combination thereof. In addition, the channel layer 542, the electrolyte layer 544, the ion reservoir layer 546, and the gate electrode layer 548 may be deposited through a process such as CVD, ALD, sputtering, or evaporation.

Figure 5H:
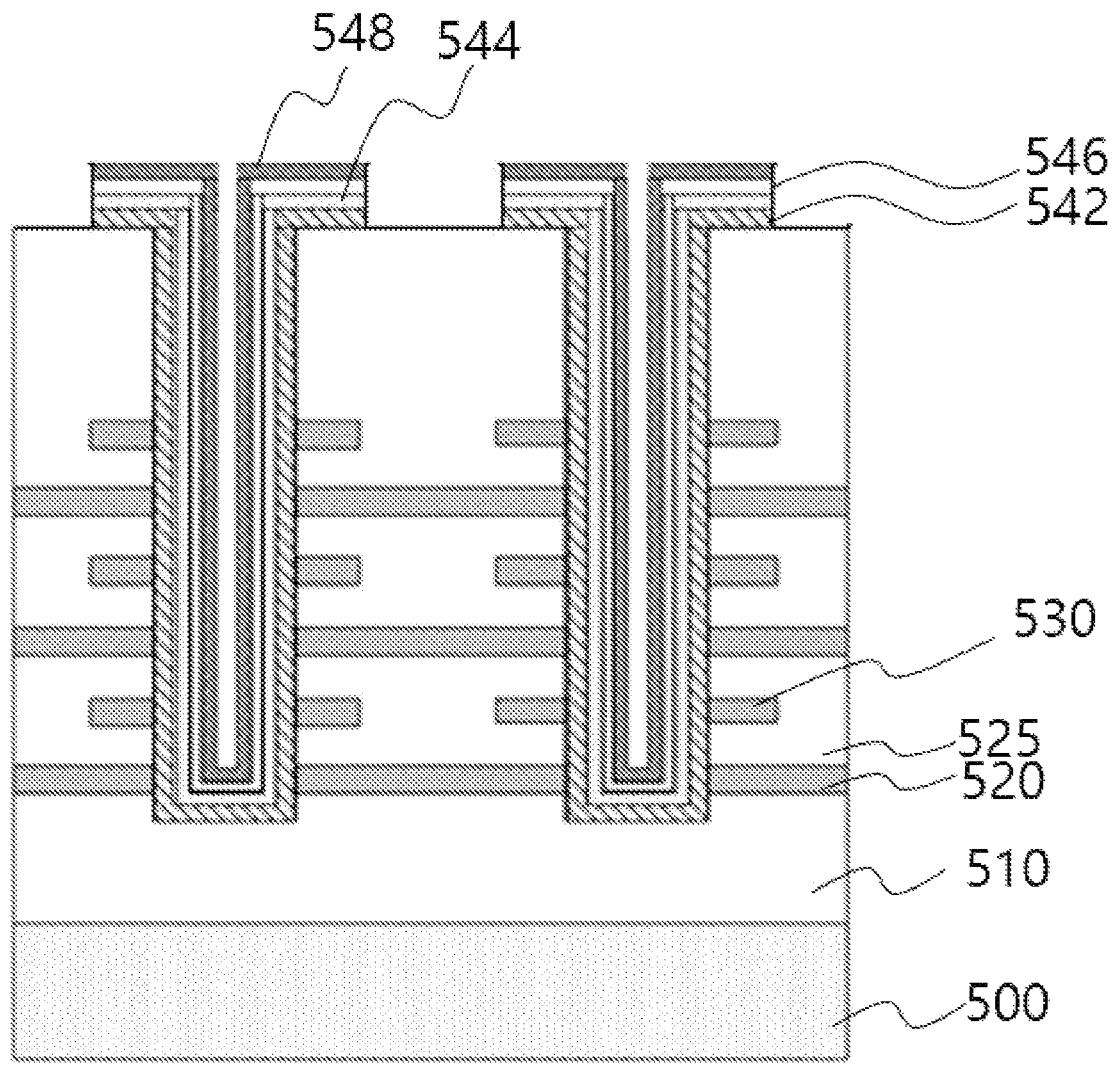

Referring to FIG. 5H, separated gate electrodes are formed in each circumferential hole 540 by etching the channel layer 542, the electrolyte layer 544, the ion reservoir layer 546, and the gate electrode layer 548 on the insulator.

According to the method of forming a separated gate electrode, the separated gate electrode may be formed by forming a mask pattern on a predetermined area outside the circumferential hole 540 and the circumferential hole 540 and etching the channel layer 542, the electrolyte layer 544, the ion reservoir layer 546, and the gate electrode layer 548 using the mask pattern as an etching mask and then removing the mask pattern, but the present disclosure is not limited to the above method.

Figure 5I:
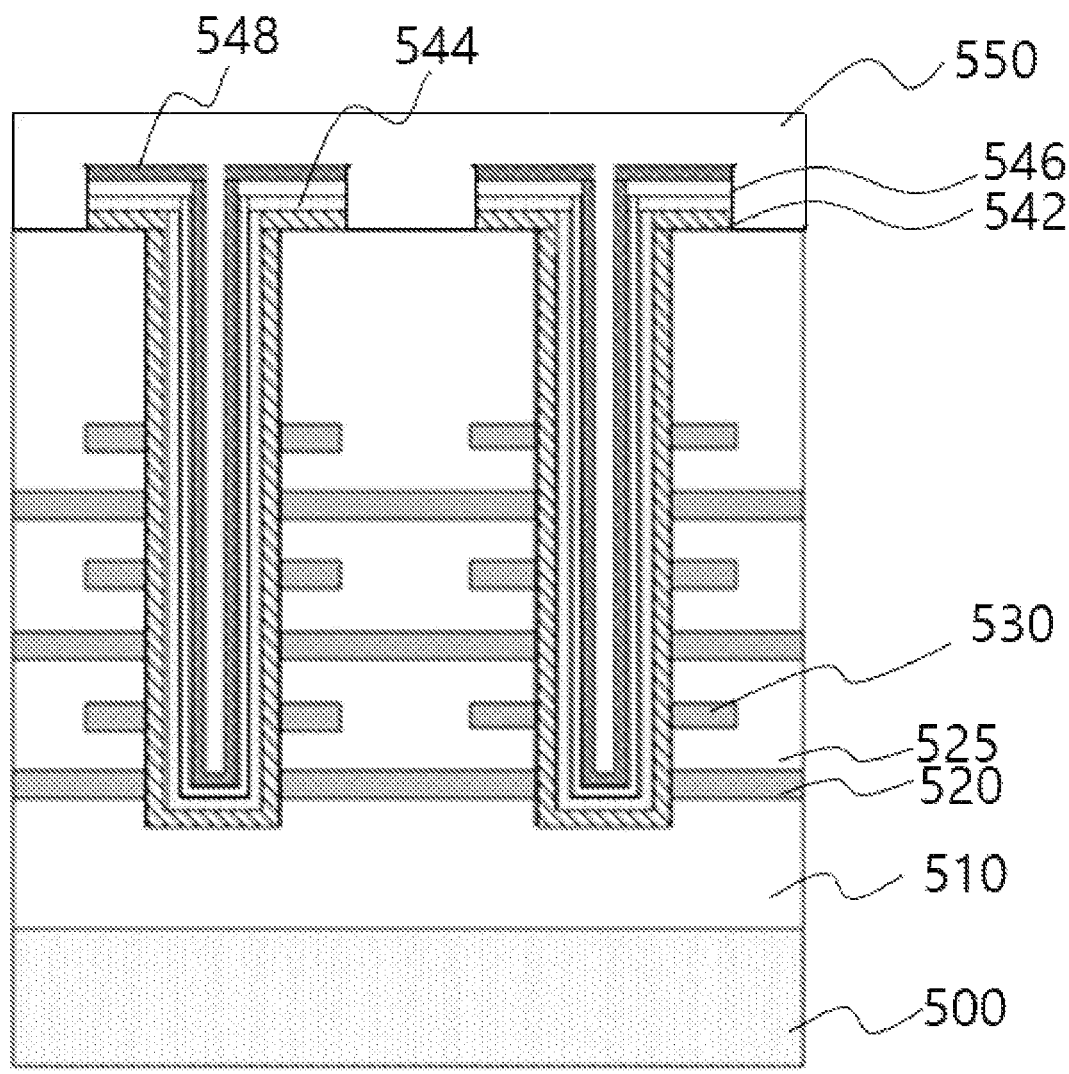

Referring to FIG. 5I, an interlayer insulating layer 550 is formed over the entire upper portion including the separated gate electrode. In this case, the interlayer insulating layer 550 is preferably formed so that the inside of the separated gate electrode, that is, the inside of the circumferential hole 540 is completely buried.

Figure 5J:
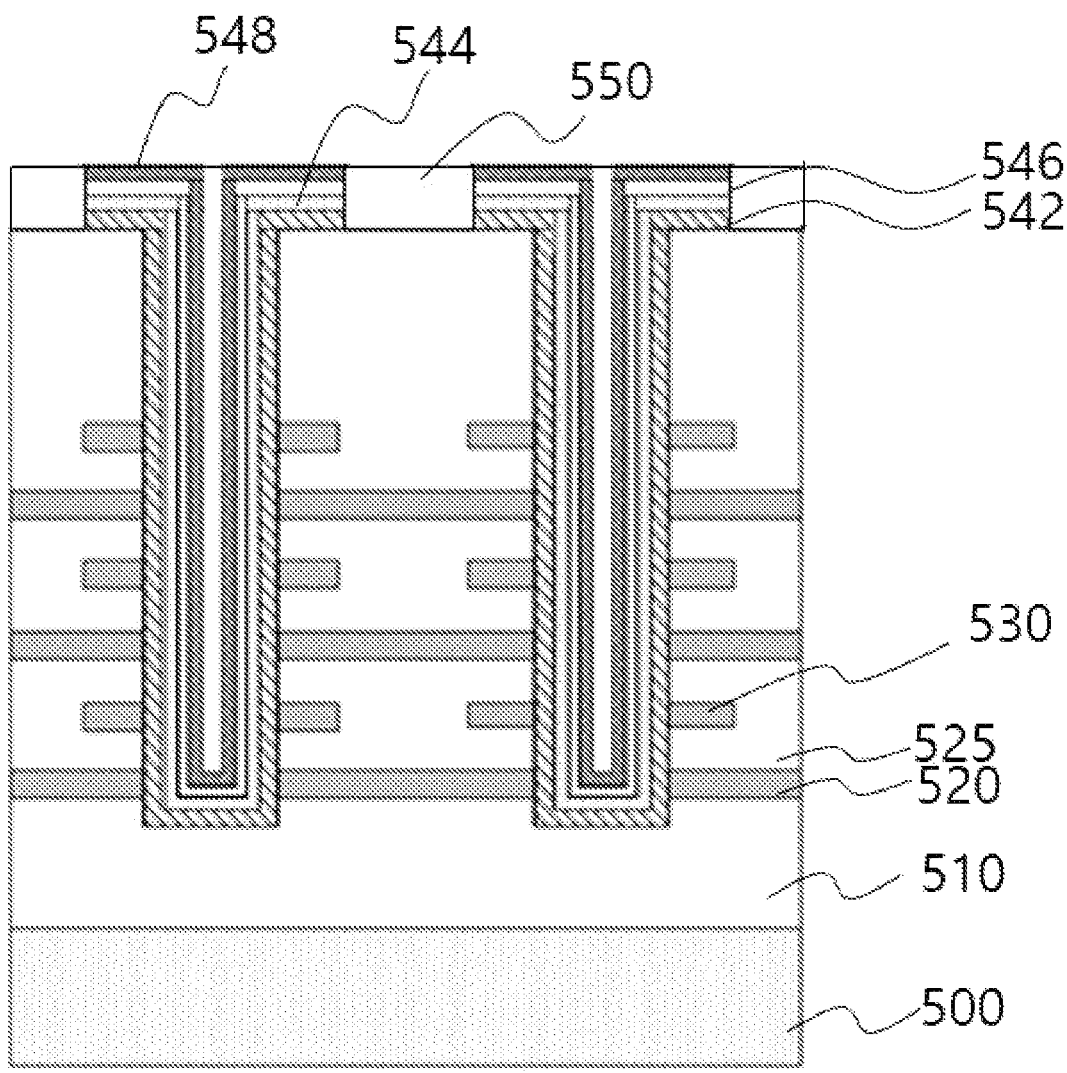

Referring to FIG. 5J, the interlayer insulating layer 550 is etched through an etch-back etching process until the gate electrode layer 548 is exposed.

Figure 5K:
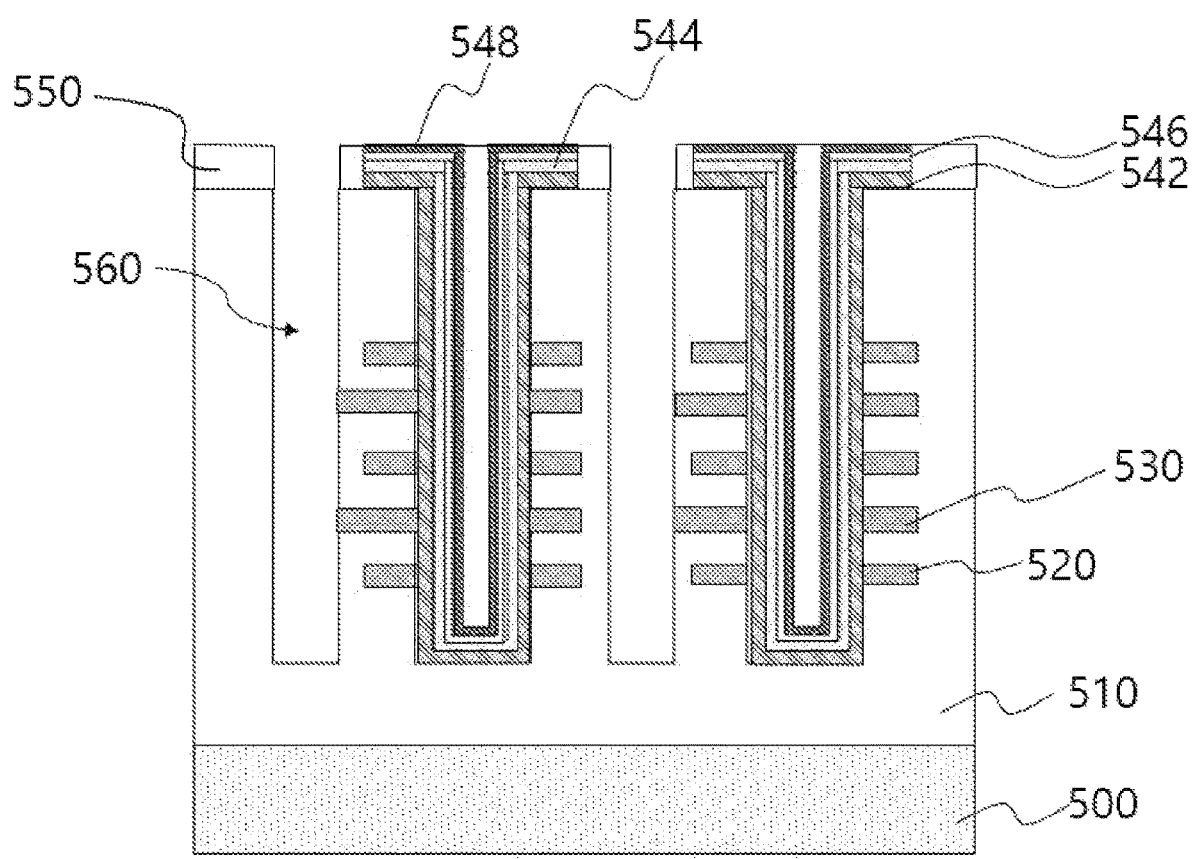

FIG. 5K illustrates a cross section taken along Y-Y' cut section of FIG. 3, and a via hole 560 is formed by sequentially etching the interlayer insulating film 550, the stacked structure 535, and the interlayer insulating film 510 on one side of the separated gate electrode. In this time, it is preferable to etch the via hole 560 in a range in which the second conductive electrode layer 530 is exposed to one side of the via hole 560 and the first conductive electrode layer 520 is not exposed.

Figure 5L:
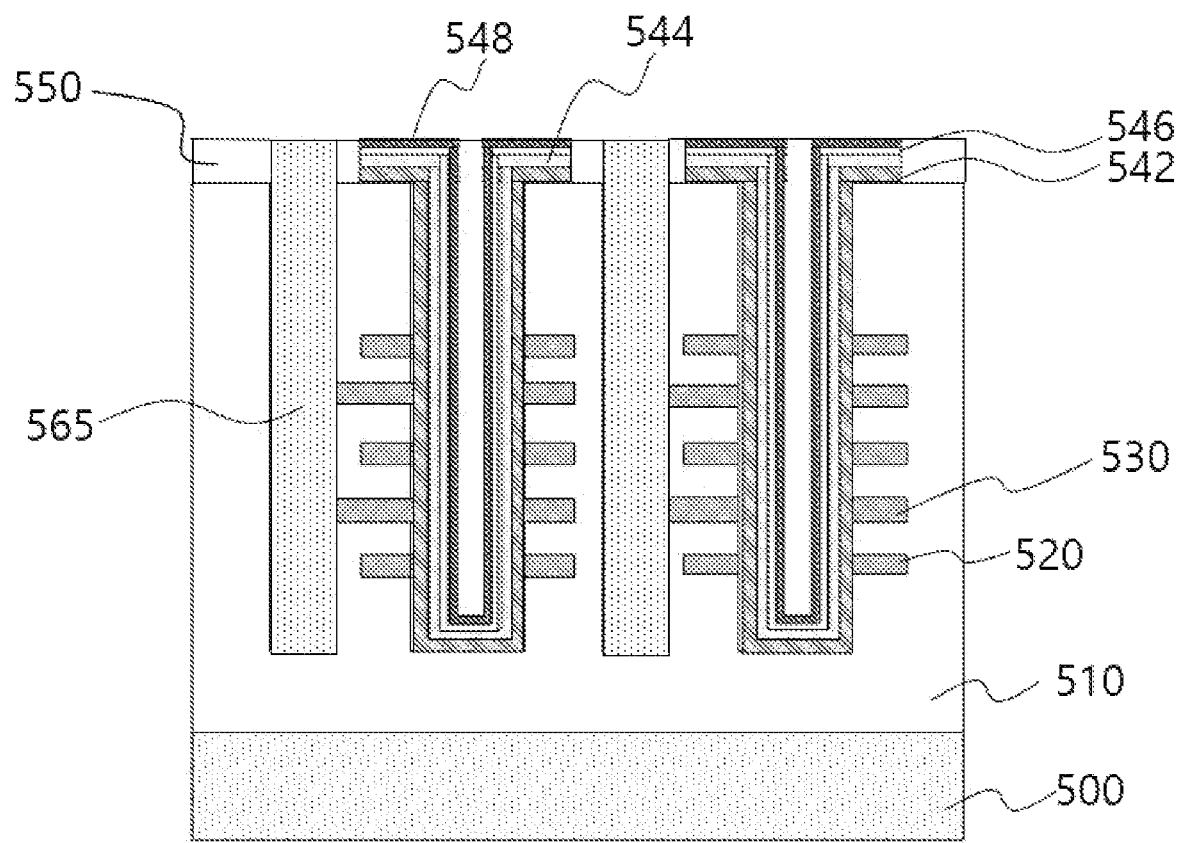

Referring to FIG. 5L, a conductive electrode material is formed on the entire upper portion including the via hole 560. Thereafter, the conductive electrode material is etched through an etch-back process until the gate electrode layer 548 is exposed to form a drain via contact 565, in which the conductive electrode material is buried, in the via hole 560. The drain via contact 565 may connect the drain line in the depth direction.

As described above, according to the present disclosure, it is possible to reduce the area occupied by the memory cell compared to the related art to enable miniaturization and high performance of the device by forming a multi-layered three-dimensional vertical structure type electrochemical memory cell in a limited space, and implement a high-density array by forming more memory cells in the same area. For example, it is possible to reduce three-dimensional vertical structure type memory cell to 6F2, which is smaller than the conventional 12F2 or 8F2. In addition, as the multi-layered three-dimensional vertical structure type memory cell is formed, the source/drain has a parallel structure, and this structure determines the channel length through the thickness of the insulator formed between the source/drain. Since the thickness of the insulator can be reduced by the deposition process, the channel length may be adjusted in a more efficient way than in the lithography process that is generally performed.

Although exemplary embodiments of the present invention have been disclosed hereinabove, it may be understood by those skilled in the art that the present invention may be variously modified and altered without departing from the scope and spirit of the present invention described in the following claims.

The disclosed technology can have the following effects. However, since a specific embodiment is not construed as including all of the following effects or only the following effects, it should not be understood that the scope of the disclosed technology is limited to the specific embodiment.

According to three-terminal electro-chemical memory cells with a vertical structure for neuromorphic computation and a memory cell array including the same according to an embodiment of the present disclosure, it is possible to simplify the process and improve the integration of the device by forming a multi-layered three-dimensional vertical structure type electro-chemical memory cell.

What is claimed is:

1. A three-terminal electro-chemical memory device with a vertical structure for neuromorphic computation, comprising:
    a circumferential hole;
    first and second conductive electrode layers sequentially stacked along an outer surface of the circumferential hole;
    an electrolyte layer formed along an inner surface of the circumferential hole and connected to one end of each of the first and second conductive electrode layers;
    a gate electrode layer disposed parallel to the electrolyte layer in an inner surface direction of the circumferential hole; and
    an insulator filled in an inner surface of the gate electrode layer.

2. The three-terminal electro-chemical memory cell of claim 1, wherein the first and second conductive electrode layers constitute a disk shape in contact with the outer surface of the circumferential hole, and are spaced apart through another insulator.

3. The three-terminal electro-chemical memory cell of claim 1, wherein the electrolyte layer is formed as a circumferential surface inside a circumferential channel layer in contact with the inner surface of the circumferential hole.

4. The three-terminal electro-chemical memory cell of claim 3, further comprising:
    an ion reservoir layer in contact with the inner surface of the electrolyte layer and formed as the circumferential surface.

5. The three-terminal electro-chemical memory cell of claim 4, wherein the ion reservoir layer is made of Mo oxide.

6. A three-terminal electro-chemical memory cell with a vertical structure for neuromorphic computation, comprising:
    a circumferential hole;
    first and second conductive electrode layers sequentially stacked along an outer surface of the circumferential hole;
    a channel layer formed along an inner surface of the circumferential hole and connected to one end of each of the first and second conductive electrode layers; and
    a gate electrode layer disposed parallel to the channel layer in an inner surface direction of the circumferential hole; and an insulator filled in an inner surface of the gate electrode layer.

7. The three-terminal electro-chemical memory cell of claim 6, wherein the first and second conductive electrode layers constitute a disk shape in contact with the outer surface of the circumferential hole, and are spaced apart through another insulator.

8. The three-terminal electro-chemical memory cell of claim 6, wherein the channel layer is formed between the inner surface of the circumferential hole and an outer surface of an electrolyte layer formed as a circumferential surface.

9. The three-terminal electro-chemical memory cell of claim 8, further comprising:
an ion reservoir layer in contact with the inner surface of the electrolyte layer and formed as the circumferential surface.

10. The three-terminal electro-chemical memory cell of claim 9, wherein the ion reservoir layer is made of Mo oxide.

11. A circumferential three-terminal memory cell with a vertical structure for neuromorphic computation, comprising:
a channel layer, an electrolyte layer, and a gate electrode layer sequentially forming a circumferential surface toward an inside;
first and second conductive electrode layers sequentially stacked in a disk shape on an outside of the circumferential surface; and
an insulator filled in an inner surface of the gate electrode layer.

12. An array of three-terminal memory cell with a vertical structure for neuromorphic computation, comprising:
a channel layer, an electrolyte layer, and a gate electrode layer sequentially forming a circumferential surface toward an inside;
first and second conductive electrode layers sequentially stacked in a disk shape on an outside of the circumferential surface;
a drain line connected to the first conductive electrode layer;
a source line connected to the second conductive electrode layer;
a gate line connected to the gate electrode layer; and
an insulator filled in an inner surface of the gate electrode layer.

* * * * *